United States Patent [19]
Suchoff et al.

[11] Patent Number: 5,729,574
[45] Date of Patent: Mar. 17, 1998

[54] SINGLE CHANNEL FIR FILTER ARCHITECTURE TO PERFORM COMBINED/PARALLEL FILTERING OF MULTIPLE (QUADRATURE) SIGNALS

[75] Inventors: Michael Suchoff, Chapel Hill, N.C.; Andrew C. Barber, Venice, Calif.

[73] Assignee: Harris Corporation, Melbourne, Fla.

[21] Appl. No.: 727,349

[22] Filed: Oct. 8, 1996

[51] Int. Cl.$^6$ .......................................... H04L 5/12
[52] U.S. Cl. ..................... 375/261; 375/235; 375/350; 364/724.16
[58] Field of Search ........................ 375/235, 261, 375/298, 349, 350; 332/103, 104; 364/724.01, 724.16, 724.17, 724.19, 724.2

[56] References Cited

U.S. PATENT DOCUMENTS 5,222,035  6/1993  Nakase et al. ................ 364/724.16
5,515,402  5/1996  Chester ............................. 375/350

*Primary Examiner*—Stephen Chin
*Assistant Examiner*—Amanda T. Le
*Attorney, Agent, or Firm*—Charles E. Wands

[57] ABSTRACT

A reduced hardware complexity, reduced computational intensity finite impulse response filter architecture for filtering multiple (quadrature) channels of an RF modem comprises a cascaded arrangement of L data register stages through which respective digitally encoded data sample values of a signal to be filtered are sequentially clocked. Each data register stage has a data capacity greater than twice the code width of a respective digitized channel sample, so that each register stage can store both I and Q channel data. A multiplier unit is coupled to the data register and multiplies both I and Q contents of respective ones of the register stages by respective impulse response coefficient values. The resulting I and Q products are summed into I and Q channel convolutional sums.

16 Claims, 1 Drawing Sheet

5,729,574

SINGLE CHANNEL FIR FILTER ARCHITECTURE TO PERFORM COMBINED/PARALLEL FILTERING OF MULTIPLE (QUADRATURE) SIGNALS

FIELD OF THE INVENTION

The present invention relates in general to communication systems, and is particularly directed to a reduced hardware complexity, reduced computational intensity signal processing architecture, such as may be used to implement a finite impulse response filter, for filtering multiple (quadrature) channels of an RF modem.

BACKGROUND OF THE INVENTION

The output of a quadrature modulation modem contains two signals, termed X and Y signals, or in-phase (I) and quadrature-phase (Q) signals, each of which must be low pass-filtered in order to remove unwanted frequencies from the transmitted spectrum. To avoid the introduction of group delay, which would otherwise prevent correct demodulation of the filtered channels, a finite impulse response (FIR) filter is customarily employed, as an FIR filter is phase linear, introducing no group distortion.

A conventional digital implementation of an FIR filter for a respective channel is diagrammatically illustrated in FIG. 1 as comprising a data sample delay line 10 formed of a cascaded arrangement of a plurality of data register ($Z^{-1}$) stages 11-1, 11-2, . . . , 11-N, through which respective digitally encoded data sample values of a respective modem channel are sequentially shifted or clocked. The data content of a respective storage register stage 11-i is applied to one input of a multiplier 1B-i, a second input of which is coupled to receive a respective impulse response coefficient value H, as may be sourced from the modem's microcontroller, where discrete components are employed or stored in memory where the filter is implemented with a general purpose digital computer. The respective products generated by multipliers 13 are then summed together, as by way of a set of adders 15, to produce the desired convolution as the filtered output.

Thus, to implement an FIR filter having a symbol span or length L will typically require an architecture having L register stages 11, L multipliers 13 and L adders 15. For the case of a quadrature modulated signal containing respective I and Q channels, for example, the filter therefore twice the complexity of a single channel architecture, namely 2L register stages 2L multipliers, and 2L adders. Unfortunately, at RF modem data rates on the 1 Gb/s, the cost of the signal processing components to implement such an FIR filter for a pair of (quadrature) channels is prohibitive. Further, there are currently no commercially available modem-installable general purpose computer chips that run fast enough to implement two separate FIR filters required for processing quadrature channel signals at such data rates.

SUMMARY OF THE INVENTION

In accordance with the present invention, the above-described signal processing speed problem is effectively solved by taking advantage of the data size differential between the code width of encoded data samples propagating through the ($Z^{-1}$) register stages and the available data space in each respective ($Z^{-1}$) register stage of a standard single stage FIR filter architecture, so as to allow both quadrature channels to be filtered in parallel in a common single channel architecture, thus significantly reducing hardware and computational complexity.

As a non-limiting example, each cascaded data $Z^{-1}$ register stage of the data sample delay line may have a data capacity of some conventional digital bit size, such as sixteen, thirty-two, or sixty-four bits. For a data capacity of sixteen bits, each of the delay line's register stages includes a most significant or upper eight bits $D_8$–$D_{15}$, and a least significant or lower eight bits $D_0$–$D_7$. As the code width into which sampled data values of a respective channel signal are encoded is less than half the data capacity of each $Z^{-1}$ register stage, there will be no data overflow between adjacent portions of a respective register stage.

Further, the average code width of each impulse response coefficient is considerably less than the encoded size of a data sample, so that accumulation or summation of the respective pairs of product subportions of each two channel-representative product from each multiply operation does not result in an overlap or carry from the contents of the lower bit-associated product sums into the upper bit-associated product sums.

For convolutional filter processing of digitally encoded data samples associated with a pair of quadrature (I and Q) channels, successive ones of reduced code width digitized I and Q channel samples are loaded in parallel into the respective upper eight bits $D_8$–$D_{15}$, and lower eight bits $D_0$–$D_7$ of an input register stage of the filter's data sample delay line, and then sequentially clocked or shifted through the associated upper and lower eight bit stages of the cascaded downstream register stages of the delay line. As note above, since the code widths of the respective I and Q channel data samples being shifted through their associated eight bit portions of the sixteen bit wide register stages are smaller than the full code width resolution of those register stages, the unused upper bit portion of the lower eight bits $D_0$–$D_7$ of a respective register stage will not overlap the lower bit portion of the upper eight bits $D_8$–$D_{15}$. Therefore, each (sixteen bit) register stage can be considered as two independent eight bit register stages, one of which stores a respective I channel digitized data sample and the other of which stores its associated Q channel digitized data sample.

As in the filter architecture configuration of FIG. 1, the data content of the entirety (sixteen bits) of a respective storage register stage is applied to one input of an associated multiplier, a second input of which is coupled to receive a respective impulse response coefficient value sourced from the modem's microcontroller. The respective pairs of products generated by each multiplier are then summed together, to produce a sixteen bit wide convolution summation value. This sixteen bit wide sum is comprised of two separate eight bit wide components, the values of which do not overlap or carry into one another, as described above so that each eight bit wide summation segment may be output as a respective one of the I and Q channel convolution sums.

DETAILED DESCRIPTION

Figure 1:
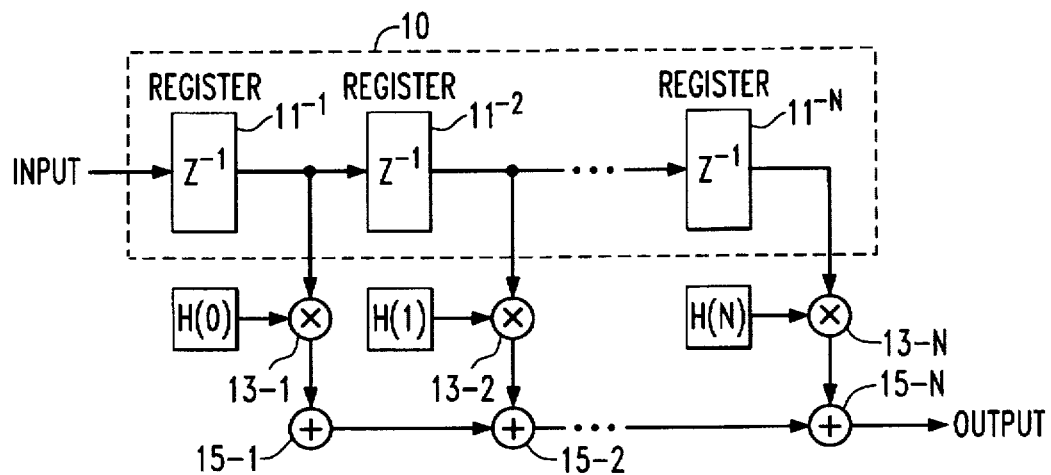
FIG. 1 diagrammatically illustrates a conventional digital hardware implementation of an FIR filter.

Before describing in detail the new and improved parallel FIR filter architecture in accordance with the present invention, it should be observed that the invention resides primarily in what is effectively a prescribed arrangement of conventional communication circuits and associated digital signal processing components and attendant supervisory control circuitry therefor, that controls the operations of such circuits and components. Consequently, the configuration of such circuits components and the manner in which they are interfaced with other communication system equipment have, for the most part, been illustrated in the drawings by readily understandable block diagrams, which show only those specific details that are pertinent to the present invention, so as not to obscure the disclosure with details which will be readily apparent to those skilled in the art having the benefit of the description herein. Thus, the block diagram illustrations are primarily intended to show the major components of the system in a convenient functional grouping, whereby the present invention may be more readily understood.

As described briefly above, the problems of reduced signal processing speeds of commercially available general purpose computers and the high cost of special purpose digital signal processing components for implementing multiple filter channels are effectively remedied in accordance with the present invention by taking advantage of the code width differential between the encoded data samples propagating through the filter's register stages and the available data space in each respective register stage, so as to allow multiple channels to be filtered in parallel using a common filter architecture. For a pair of quadrature channels, the principal benefit afforded by the present invention is the ability to halve the number of computations required.

Figure 2:
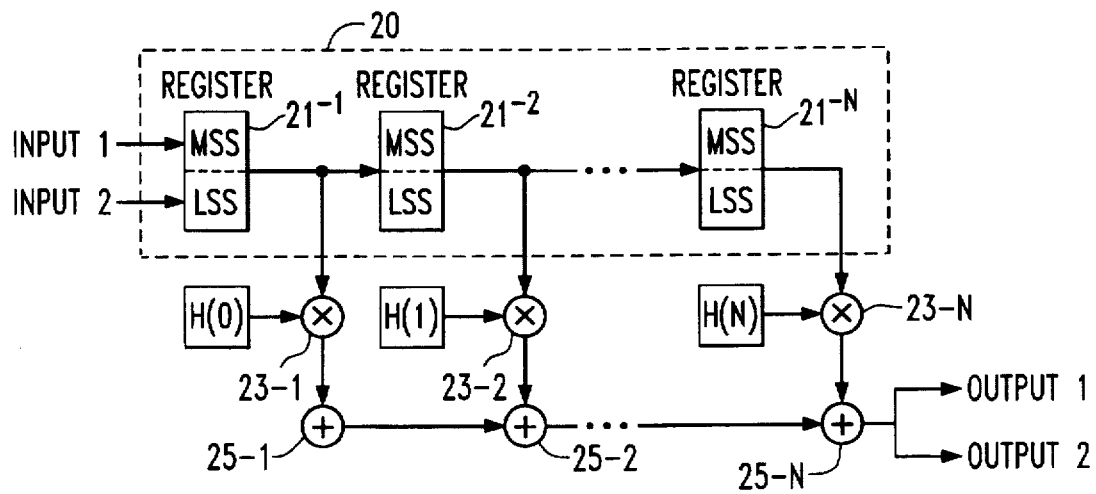
FIG. 2 diagrammatically illustrates a digital architecture of an FIR filter for a pair of quadrature channels in accordance with reduced code width, parallel processing scheme of the present invention.

Referring now to FIG. 2, a non-limiting example of an embodiment of a digital hardware implementation of an FIR filter for a pair of (quadrature) channels in accordance with the present invention is diagrammatically illustrated as comprising a data sample delay line 20 containing a cascaded arrangement of delay stages $Z^{-1}$ or data registers 21-1, 21-2, ...., 21-N. Each data register has a data capacity of some prescribed code size, such as sixteen, thirty-two, sixty-four bits, as non-limiting examples. For purposes of the present description, it will be assumed that each register stage 21-i is a sixteen bit wide stage, comprised of a most significant stage portion MSS of an upper eight bits $D_8-D_{15}$, and a least significant stage portion LSS or lower eight bits $D_0-D_7$.

Further, the code width into which sampled values of a respective channel signal are encoded by an analog-to-digital conversion front end of the modem will be assumed to be a resolution (such as a five bit data resolution as a non-limiting example), that is less than half the bit capacity of each $Z^{-1}$ register stage 21. It will be further understood that the average code width of each impulse response coefficient H is considerably less than the encoded size of a data sample, so that accumulation or summation of the respective pairs of product subportions of each two channel-representative product from each multiply operation does not result in an overlap or carry of the contents of the lower bit-associated product sums into the upper bit-associated product sums. As a consequence, there will be no data overflow in constant sized data registers of a general purpose digital computer implementation for storing respective products of the multiply operations.

Pursuant to the invention, for a non-limiting example of processing data samples associated with a pair of quadrature (I and Q) channels, as successive ones of (five bit wide) digitized I and Q channel samples are digitized they are respectively loaded in parallel into the upper eight bits $D_8-D_{15}$, and lower eight bits $D_0-D_7$ of the input register stage 21-1 of encoded data sample delay line 20, and then sequentially clocked through the associated upper and lower eight bit stages of cascaded register stages 21-2, ..., 21-N.

As noted above, because the code widths of the respective I and Q channel data samples being shifted through their associated eight bit portions of the sixteen bit wide register stages 21 are smaller than the data capacities of those register stages, the unused upper bit portion of the lower eight bits $D_0-D_7$ of a respective register stage 21-i will not overlap the lower bit portion of its upper eight bits $D_8-D_{15}$.

Therefore, each (sixteen bit) register stage 21-i can be considered as two independent eight bit register stages, one of which stores a respective I channel digitized data sample and the other of which stores its associated Q channel digitized data sample. The upper eight bits may store a respective I channel digitized data sample and the lower eight bits may store its associated Q channel digitized data sample, or vice versa.

As in the filter architecture of FIG. 1, the data content of the entirety (sixteen bits) of a respective storage register 21-i is applied to one input of an associated multiplier 23-i, a second input of which is coupled to receive a respective impulse response coefficient value H(i). The respective pairs of products generated by each multiplier 23-i and stored in associated (sixteen bit wide) product registers are then summed together, as by way of a set of adders 25, to produce a sixteen bit wide convolution summation value, that contains two separate eight bit wide components.

As described above, since the accumulation or summation of the respective pairs of products from the multipliers 23 does not result in an overlap of the contents of the lower bit-associated product sums into the upper bit-associated product sums produces by adders 25, each eight bit wide summation value may be output as a respective one of the I and Q channel convolutional sums.

Thus, unlike a conventional multiple channel FIR filter configuration which, for a pair of quadrature channels, would require two sets of registers, multipliers, and adders, as described above, the present invention takes advantage of the available code width differential between the encoded data samples propagating through the filter's register stages and the available data space in each respective register stage. This allows the same signal processing architecture for implementing a single channel FIR filter to process multiple channels, thereby substantially reducing the filter's computational and hardware complexity.

While I have shown and described an embodiment in accordance with the present invention, it is to be understood that the same is not limited thereto but is susceptible to numerous changes and modifications as known to a person skilled in the art, and I therefore do not wish to be limited to the details shown and described herein but intend to cover all such changes and modifications as are obvious to one of ordinary skill in the art.

What is claimed:

1. A signal processing architecture comprising:
    a plurality of data register stages which store respective digitally encoded data values of a signal to be processed; and
    a signal processing unit coupled to respective ones of said data register stages and being operative to perform signal processing operations on said encoded data values and to produce therefrom an output representative of results of a prescribed combination of said signal processing operations; and wherein
    said signal to be processed contains a plurality of signal portions, each of which is encoded to a code width less than the data capacity of a respective register stage of said plurality of data register stages, and wherein said plurality of encoded signal portions are coupled through respectively different portions of each respective register stage of said cascaded arrangement of data register stages, in the course of said signal processing unit performing said signal processing operations on said encoded data values, so that said signal processing unit produces a plurality of outputs respectively associated with said plurality of encoded signal portions.

2. A signal processing architecture according to claim 1, wherein said plurality of data register stages comprise a cascaded arrangement of L data register stages through which respective digitally encoded data sample values of said signal to be processed are sequentially shifted, and wherein said signal processing unit is operative to multiply contents of respective ones of said L data register stages by respective impulse response coefficient values, and to sum resulting products into respective finite impulse response convolutional sums outputs associated with said plurality of signal portions.

3. A signal processing architecture according to claim 2, wherein said plurality of signal portions are respective quadrature channel portions of said signal.

4. A signal processing architecture according to claim 3, wherein each of said plurality of signal portions is encoded to a code width less than half the data capacity of a respective register stage of said plurality of data register stages.

5. A signal processing architecture according to claim 4, wherein said multiplier unit comprises a plurality of L multiplier units having first inputs thereof coupled to receive contents of respective ones of said L data register stages and second inputs thereof coupled to receive said respective impulse response coefficient values, outputs of said multipliers being summed by said adder into respective first and second convolutional sum outputs associated with said respective quadrature channel portions of said signal.

6. A finite impulse response filter architecture of symbol length L comprising:

a cascaded arrangement of L data register stages through which respective digitally encoded data sample values of a signal to be filtered are sequentially shifted;

a multiplier unit coupled to multiply contents of respective ones of said L data register stages by respective impulse response coefficient values; and an adder which sums respective products generated by said multiplier unit to produce a convolutional sum output; and wherein said signal to be filtered contains first and second channel portions, each of which is encoded to a code width less than that of a respective register stage of said cascaded arrangement of L data register stages, and wherein said encoded first and second channel portions are coupled through respectively different portions of each respective register stage of said cascaded arrangement of L data register stages, so that said convolutional sum output contains respective first and second convolutional summation portions respectively associated with said first and second channel portions.

7. A finite impulse response filter architecture according to claim 6, wherein said first and second channel portions of said signal to be filtered are respective quadrature channel portions of said signal.

8. A finite impulse response filter architecture according to claim 7, wherein said multiplier unit comprises a plurality of L multiplier units having first inputs thereof coupled to receive contents of respective ones of said L data register stages and second inputs thereof coupled to receive said respective impulse response coefficient values, outputs of said multipliers being summed by said adder into respective first and second convolutional sum outputs associated with said respective quadrature channel portions of said signal, and wherein each of said first and second channel portions of said signal is encoded to a code width less than half the data capacity of a respective register stage.

9. A method of implementing a finite impulse response filter of symbol length L for a signal containing plural channel portions sample values of which are digitally encoded to a prescribed code width, said method comprising the steps of:

(a) providing a cascaded arrangement of L data register stages through which respective digitally encoded data sample values of said signal are to be sequentially clocked, each data register stage having a data capacity greater than the code width of each of said plural channel portions;

(b) sequentially clocking respective ones of said plural channel portions through respectively different portions of each respective register stage of said cascaded arrangement of L data register stages;

(c) multiplying contents of respective ones of said L data register stages by respective impulse response coefficient values to produce a plurality of L products; and (d) summing said L products into plural convolutional summation portions respectively associated with said plural channel portions.

10. A method according to claim 9, wherein each of said channel portions of said signal to be filtered is encoded to a code width less than half the data capacity of a respective register stage of said cascaded arrangement of L data register stages.

11. A method according to claim 10, wherein said plural channel portions of said signal to be filtered are respective quadrature channel portions of said signal.

12. A method of processing a signal comprising the steps of:

(a) storing, in a plurality of data register stages, respective digitally encoded data values of said signal;

(b) processing contents of respective ones of said data register stages in accordance with prescribed signal processing operations to produce an output representative of a prescribed combination of results of said signal processing operations; and wherein said signal to be processed contains a plurality of signal portions, each of which is encoded to a code width less than the data capacity of a respective register stage of said plurality of data register stages, and wherein said plurality of encoded signal portions are coupled through respectively different portions of each respective register stage of said cascaded arrangement of data register stages, in the course of step (b) performing said signal processing operations on said encoded data values, so that step (b) produces a plurality of outputs respectively associated with said plurality of encoded signal portions.

13. A method according to claim 12, wherein said plurality of data register stages comprise a cascaded arrangement of L data register stages through which respective digitally encoded data sample values of said signal to be processed are sequentially shifted, and wherein step (b) multiplies contents of respective ones of said L data register stages by respective impulse response coefficient values, and sums resulting products into respective finite impulse response convolutional sums outputs associated with said plurality of signal portions.

14. A method according to claim 13, wherein said plurality of signal portions are respective quadrature channel portions of said signal.

15. A method according to claim 14, wherein each of said plurality of signal portions is encoded to a code width less than half the data capacity of a respective register stage of said plurality of data register stages.

16. A method according to claim 15, wherein step (b) carries out a plurality of L multiply operations on contents of respective ones of said L data register stages by respective impulse response coefficient values, and sums L products resulting from said L multiply operations into respective first and second convolutional sums associated with said respective quadrature channel portions of said signal.

* * * * *